United States Patent [19]

Hoyt

[11] 4,204,571
[45] May 27, 1980

[54] REFRIGERATOR TESTING ASSEMBLY

[75] Inventor: Thurber I. Hoyt, Esmond, R.I.

[73] Assignee: Helix Technology Corporation, Waltham, Mass.

[21] Appl. No.: 951,806

[22] Filed: Oct. 16, 1978

[51] Int. Cl.² .................... F25B 27/00; H01L 23/34; H01R 33/00
[52] U.S. Cl. .................... 165/80 A; 29/758; 62/514 JT; 338/25
[58] Field of Search ............... 73/343 R; 62/514 JT; 81/90 C; 29/278, 758, 280; 338/30; 165/80 B, 80 A

[56] References Cited

U.S. PATENT DOCUMENTS

| | | | |
|---|---|---|---|
| 3,081,631 | 3/1963 | Switzer, Jr. et al. | 73/343 R |
| 3,151,484 | 10/1964 | Feehan et al. | 73/343 R X |
| 3,195,620 | 7/1965 | Steinhardt, Jr. | 62/514 R X |
| 3,356,904 | 12/1967 | Yonkers | 165/80 B X |
| 3,693,484 | 9/1972 | Sanderson, Jr. | 81/90 C |
| 3,732,421 | 5/1973 | Kunimoto et al. | 62/514 JT X |
| 3,953,097 | 4/1976 | Graham | 81/90 C X |
| 4,028,907 | 6/1977 | Herrington et al. | 62/514 JT X |
| 4,054,901 | 10/1977 | Edwards et al. | 165/80 A |
| 4,074,717 | 2/1978 | Schulze et al. | 62/293 X |

Primary Examiner—Daniel M. Yasich
Attorney, Agent, or Firm—David E. Brook; James M. Smith

[57] ABSTRACT

Sensitive testing transducers are mounted to an internally threaded cap. A split-ring sleeve having external threads is positioned around the cold tip of a cryogenic refrigerator. An internal flange on the sleeve abuts a shoulder on the cold tip to hold the sleeve on the cold tip while permitting rotation thereof. By positioning the cap over the cold tip and rotating the sleeve, the transducer supporting cap is moved into tight thermal contact with the end of the cold tip without disturbing the sensitive transducers.

10 Claims, 4 Drawing Figures

REFRIGERATOR TESTING ASSEMBLY

BACKGROUND OF THE INVENTION

This invention relates to a refrigerator testing assembly, and more particularly to an assembly for positioning transducers in thermal contact with the end of a refrigerator cold tip.

For monitoring and testing the cooling capacity of a cryogenic refrigerator, it is common practice to attach a resistance heat load and temperature sensor to the cold tip at the end of a cold finger of the refrigerator. A closefitting vacuum chamber is then placed over the cold tip and operation of the refrigerator is monitored. Usually, the heating and sensing transducers are mounted on a copper adapter which is soldered, glued or clamped onto the end of the cold tip. The walls of the cold finger are paper thin; and because removal of the adapter from the cold tip could damage or mar the finger, it has not been feasible to thus monitor the cooling capacity of all units before sale. Rather, quality control has been based on the testing of only selected ones of the refrigerators.

Another problem encountered in prior methods of attaching transducer supporting adapters to cold tips has been that, to test under a wide range of conditions, limited range transducers must be replaced at various steps of the testing procedure.

The difficulties encountered in removing and replacing transducer adapters are complicated by the fact that the transducers and their connecting electrical leads are extremely delicate. For example, the leads are commonly hair-like fine gold wire.

An object of this invention is to provide a means for removably mounting a transducer assembly in good thermal contact to the end of a cold tip.

A further object of this invention is to provide a transducer assembly whereby removal of the assembly can be made without damaging the sensitive transducers and without damaging or marring the cold tip of the refrigerator.

SUMMARY

A cold tip refrigerator testing assembly comprises a threaded sleeve for rotatably surrounding the cold tip of the refrigerator and a testing transducer supporting cap having complementary threads. By rotating the sleeve the transducer supporting cap is moved axially relative to the cold tip into tight thermal contact with the tip.

According to further aspects of the invention, the sleeve is an externally threaded one and it is held against axial movement by means of an internal flange which abuts against a shoulder on the cold tip.

According to further aspects of the invention, the sleeve is a split ring which may be expanded to fit over the cold tip below the shoulder. Axial tangs extend from the sleeve and may be engaged by a wrench to rotate the sleeve within the transducer supporting cap.

BRIEF DESCRIPTION OF THE DRAWINGS

The foregoing and other objects, features, and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF A PREFERRED EMBODIMENT

Figure 1:
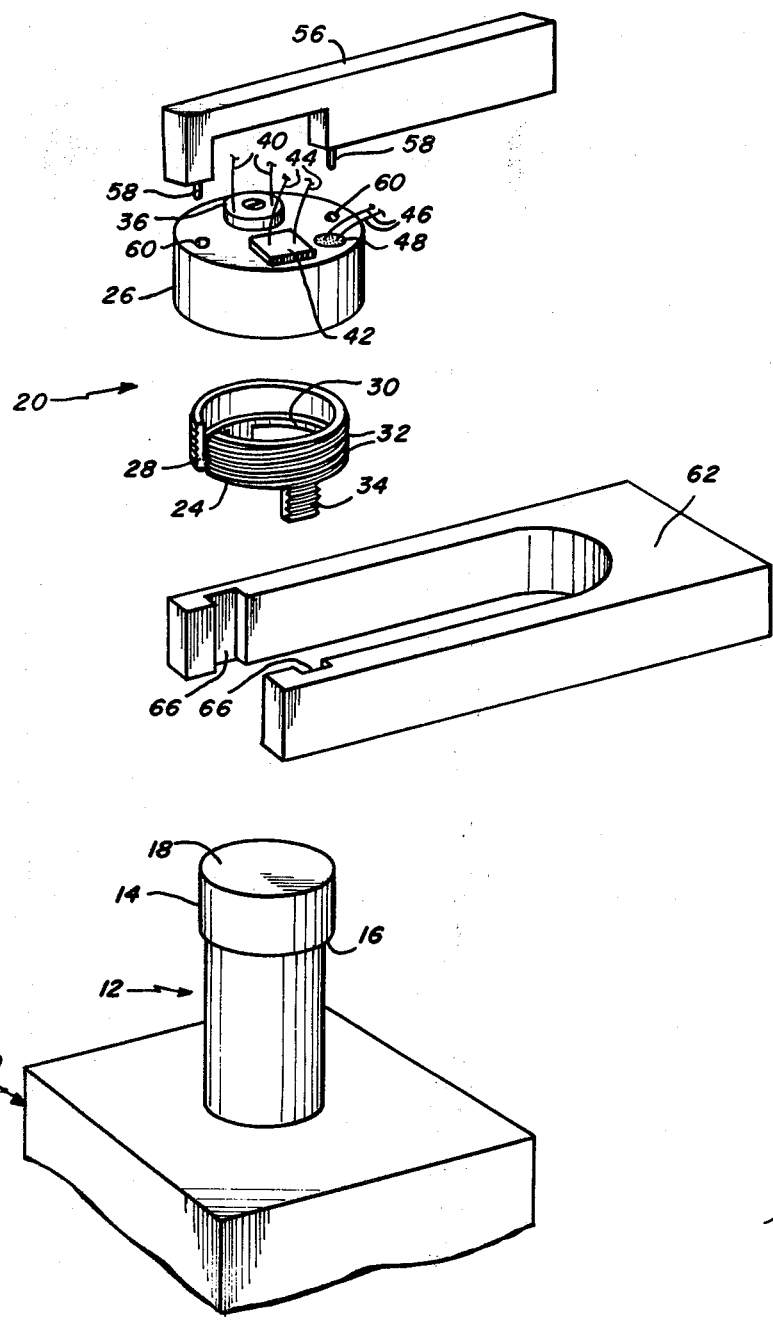
FIG. 1 is an exploded perspective view of the two piece testing assembly positioned over a refrigerator cold tip with a cap holding wrench and a sleeve rotating wrench.

As shown in FIG. 1, a cryogenic refrigerator 10 includes a cold finger 12. The cold finger includes a gas expanding displacer (not shown) therein as is well known in the art. As viewed in FIG. 1, the upper end or cold tip 14 of the cold finger has a slightly increased diameter to define a downwardly directed shoulder 16. In accordance with the present invention, means are provided for positioning testing transducers in thermal contact with the upper surface 18 of the cold tip.

Figure 2:
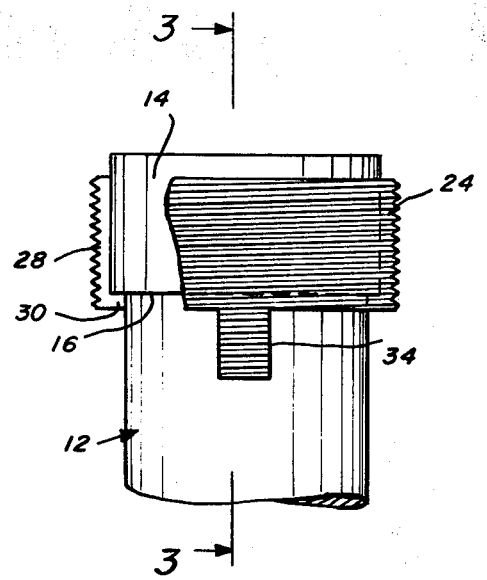
FIG. 2 is a side view of the upper end of the cold tip with the split ring sleeve, partially broken away, positioned thereon.

A testing assembly 20 includes two parts, a split ring sleeve 24 and a transducer supporting cap 26. The sleeve 24 is split at 28 in order that the sleeve can be spread apart to be moved downwardly over the cold tip 14 of the cold finger 12. The primary internal diamter of the sleeve is about the same as the outer diameter of the tip 14; however, an internally directed flange 30 provides a lesser internal diameter closer to the diameter of the cold finger below the tip 14. Thus, by spreading the split-ring sleeve 24 the sleeve can be moved downwardly over the tip 14 until the flange 30 passes the tip. When then released, the sleeve 24 springs back to surround and grip the cold tip as shown in FIG. 2. With the flange 30 abutting against the shoulder 16 of the cold tip, upward axial movement of the sleeve is prohibited.

The sleeve 24 also includes external helical threads 32 and two axially directed tangs 34 the purpose of which will be set forth subsequently.

The transducer supporting cap 26 supports at least one and preferably a number of test transducers. One such transducer is a small, disc shaped resistance heater 36 mounted to the cap by a screw. Fine wire leads 40 extend from the heater to an electrical heater control (not shown). A platinum resistance thermometer 42 is glued to the supporting cap using an epoxy. It too has fine wire leads 44 connected thereto. A thermocouple element 45 connected to leads 46 is also provided. The thermocouple element is embedded in a potting material 48 in a hole 50 drilled into the cap. Although the hole shown extends axially, that or another hole may extend transversely from the circumferential surface of the cap 26.

Additional testing transducers such as thermistors and temperature sensors having various operating ranges may also be mounted to the transducer supporting cap 26.

Figure 3:
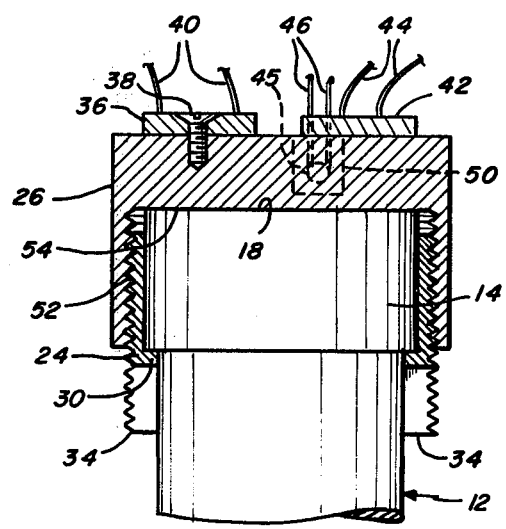
FIG. 3 is a view similar to FIG. 2 showing the transducer supporting cap and split-ring sleeve in section in the testing position.

As shown in FIG. 3, the cap 26 has internal threads 52 which are complementary with the external threads of the sleeve 24. In use, the split ring sleeve 24 is moved into position around the cold tip 14 as shown in FIG. 2. The transducer supporting cap 26 is then positioned at the end of the cold tip in contact with the sleeve 24.

With rotation of the sleeve, the cap 26 is pulled axially until its inner axially directed surface 54 makes tight contact with the upper surface 18 of the tip 14.

The cap 26 is of a material having high thermal conductivity, such as oxygen free copper, and thus places the testing transducers in good thermal contact with the cold tip 14. The sleeve 24 may be of the same material; but it may also be of an insulating material such as stainless steel, plastic or the like.

By rotating the split ring sleeve 24 and not the transducer supporting cap 26, the cap, with its sensitive sensors and connecting leads, can be held very steady to avoid damaging the sensors or breaking the leads. Yet the transducer supporting cap 26 can still be brought into tight contact with the end of the cold tip without the need for solder or bulky clamps. The use of bulky clamps must be avoided to avoid interference with the vacuum chamber subsequently placed over the cold tip.

Figure 1A:
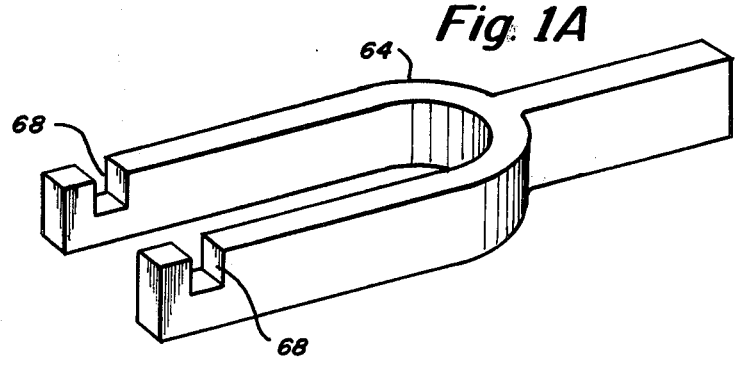
FIG. 1A is a perspective view of an alternative sleeve rotating wrench.

In order to facilitate positioning of the testing assembly on the end of the cold tip and later removal of the assembly, special tools shown in FIGS. 1 and 1A are provided. To hold the cap 26 steady, a pin wrench 56 having two pins 58 extending therefrom is provided. The pins 58 are adapted to be inserted into pin holes 60 on the top surface of the cap 26 to hold the cap against rotational movement when the sleeve 24 is rotated.

To rotate the sleeve 24 a two fingered wrench 62 (FIG. 1) or the wrench 64 (FIG. 1A) may be provided. Wrench 62 has vertical grooves 66 facing each other, each adapted to grip a tang 34 of the sleeve 24. Similarly, the wrench 64 includes horizontal grooves, each adapted to grip a tang 34 from below. The wrenches may be of Teflon (a trademark for polytetrafluoroethylene), nylon, or any other suitable material.

The wires 40, 44 and 46 are connected to a vacuum chamber (not shown). To avoid heat losses, the cap 26 is connected to the vacuum chamber by the wires only; thus, the cap is otherwise free to move relative to the chamber. In the past, when a transducer supporting adapter was soldered to the cold tip, long leads were required to permit soldering of the adapter without interference from the chamber and without disconnecting the leads. With the present invention it is only necessary that the top of the vacuum chamber be lifted a fraction of an inch to thus provide a short space between parts of the vacuum chamber adjacent the sleeve 24 and the cap 26. Then, the cap can be held against rotation by a wrench such as the pin wrench 56, and the sleeve 24 can be rotated to disconnect the transducer supporting cap. After the cap is disconnected, the chamber can be removed completely without further extension of the leads. This procedure enables shortening of the leads to a minimum length. The wrenches also eliminate the need to touch any part of the cold finger or testing device. Such touching might soil the instruments and cause testing errors.

While the invention has been particularly shown and described with reference to a preferred embodiment thereof, it will be understood by those skilled in the art that various changes in form and details may be made therein without departing from the spirit and scope of the invention as defined by the appended claims. For example, the cap 26 is shown as a one-piece element having unitary top and side portions. However, the cap may, for example, be in two pieces with the transducers mounted to a button or disc. The button would be clamped to the top 18 of the cold finger by an outer sleeve with the internal threads 52. An inwardly directed flange at the upper end of that outer sleeve would clamp down on the button with rotation of the split ring sleeve 24. The button and outer clamping sleeve would thus constitute the transducer supporting cap of the present invention.

What is claimed is:

1. A refrigerator testing assembly for holding a test transducer in tight thermal contact with a terminal end of a cold tip of a refrigerator the testing assembly comprising:
   an externally threaded sleeve for surrounding said cold tip, said sleeve and cold tip having complementary means for holding said sleeve against axial, translational movement toward the terminal end of said cold tip while permitting relative rotary movement; and
   an internally threaded transducer supporting cap having an internal axially-facing surface for contacting said cold tip, the cap having material of high thermal conductivity between said internal surface and a test transducer mounted to the cap;
   whereby said transducer supporting cap may be moved into tight contact with said cold tip to make thermal contact between said transducer and said cold tip with rotation of said threaded sleeve within said transducer supporting cap.

2. A refrigerator testing assembly as claimed in claim 1 wherein said externally threaded sleeve is a split-ring.

3. A refrigerator testing assembly as claimed in claim 1 or 2 wherein said externally threaded sleeve has an internal flange for abutting a shoulder on the cold tip to hold said sleeve against the axial, translational movement toward the terminal end of said cold tip.

4. A refrigerator testing assembly as claimed in claim 1 or 2 wherein tangs extend from said sleeve to be engaged by a wrench for rotation of said sleeve.

5. A refrigerator testing assembly as claimed in claim 4 wherein said tangs extend axially from said sleeve.

6. A refrigerator testing assembly for holding a test transducer in tight thermal contact with a terminal end of a cold tip of a refrigerator, the testing assembly comprising:
   an externally threaded split-ring sleeve for surrounding said cold tip, said sleeve having an internal flange for abutting a shoulder on said cold tip to hold said sleeve against axial, translational movement toward the terminal end of said cold tip while permitting relative rotary movement, said sleeve further having tangs extending axially therefrom to be engaged by a wrench for rotating the sleeve; and
   an internally threaded transducer supporting cap having an internal axially-facing surface for contacting said cold tip, the cap having material of high thermal conductivity between said internal surface and a test transducer mounted to the cap;
   whereby said transducer supporting cap may be moved into tight contact with said cold tip to make thermal contact between said transducer and said cold tip with rotation of said threaded sleeve within said transducer supporting cap.

7. A cold-tip-refrigerator testing assembly comprising:
   an externally threaded sleeve for rotatably surrounding the cylindrical cold tip of the refrigerator, the sleeve including means for holding it against axial translational movement toward a terminal end of the cold tip; and an internally threaded testing transducer supporting cap, the cap moving axially to contact said cold tip when said sleeve is rotated about said cold tip within said cap the cap having high conductivity material between its cold tip contacting surface and a transducer mounted thereon.

8. A cold-tip-refrigerator test assembly comprising:
 a threaded sleeve for rotatably surrounding the cold tip of the refrigerator, the sleeve including means for holding it against axial translational movement toward a terminal end of the cold tip; and
 a testing transducer supporting cap having complementary threads for axially moving the cap into contact with the cold tip with rotation of said threaded sleeve the cap having high conductivity material between its cold tip contacting surface and a transducer mounted thereon.

9. A method of removably mounting test transducers to the end of a refrigerator cold tip, the method comprising:
 positioning an externally threaded sleeve around said cold tip and holding that sleeve against axial, translational movement toward a terminal end of the cold tip;
 positioning an internally threaded transducer supporting cap over the terminal end of the cold tip; and
 rotating the threaded sleeve relative to the cold tip to move the transducer supporting cap axially into contact with said cold tip, the cap providing a high conductivity path between the cold tip and a transducer supported on the cap.

10. A method of mounting a test transducer to the end of a refrigerator cold tip, the method comprising:
 positioning a threaded, test transducer supporting cap over a terminal end of the cold tip, and
 rotating a sleeve having complementary threads and surrounding the cold tip, the sleeve being held against axial movement toward the terminal end of the cold tip and thus causing the transducer supporting cap to move axially relative to the cold tip into contact with the cold tip to provide thermal contact between the cold tip and a transducer mounted on the cap.

* * * * *